United States Patent [19]

Aston

[11] 4,238,732

[45] Dec. 9, 1980

[54] METHOD OF QUALIFYING DIODES FOR A MICROWAVE POWER COMBINER

[75] Inventor: Richard Aston, Wilkes-Barre, Pa.

[73] Assignee: General Dynamics Corporation, Pomona, Calif.

[21] Appl. No.: 24,924

[22] Filed: Mar. 29, 1979

[51] Int. Cl.³ .......................................... G01R 31/22
[52] U.S. Cl. ............................................... 324/158 D
[58] Field of Search ........... 324/158 D, 158 R, 58 R, 324/58 A, 58 B; 331/48, 56, 96, 107 R

[56] References Cited

U.S. PATENT DOCUMENTS

| | | | |
|---|---|---|---|
| 2,682,034 | 6/1954 | Torrey et al. | 324/158 D |
| 2,892,156 | 6/1959 | Dawson | 324/158 D |
| 3,191,125 | 6/1965 | Hunton et al. | 324/158 D |
| 3,452,279 | 6/1969 | DiPiazza | 324/158 D |
| 3,457,507 | 7/1969 | Overtveld | 324/158 D |
| 3,659,199 | 4/1972 | Knutson | 324/158 D |
| 3,668,522 | 6/1972 | Ghafghaichi | 324/158 D |
| 3,852,764 | 12/1974 | Smith | 343/778 |
| 3,883,805 | 5/1975 | Cohn | 324/158 D |
| 3,904,962 | 9/1975 | Olson, Jr. | 324/158 D |
| 4,080,571 | 3/1978 | Weisbrod | 324/158 D |

OTHER PUBLICATIONS

Iperen et al., An Accurate Bridge Method for Impedance Measurements of Impatt Diodes, Technical Feature, Nov. 1972 pp. 29–33.

*Primary Examiner*—Stanley T. Krawczewicz
*Attorney, Agent, or Firm*—Neil F. Martin; Edward B. Johnson

[57] ABSTRACT

The disclosed method qualifies diodes for microwave power combiners having a central cavity, and having N diode oscillator circuits spaced around the cavity for furnishing energy thereto. It includes the steps of activating only one of the N oscillator circuits, and then measuring the frequency at which the diode in that circuit supplies maximum power to the cavity. This power is measured by means of a probe having an electric field coupling of $N_{11}$ with the cavity, where $N_{11}$ equals $N_{12}/\sqrt{N}$, and where $N_{12}$ is the corresponding electric field coupling that is used to remove power from the cavity when all N of the oscillator circuits are simultaneously activated. These steps are repeated on each of the individual diodes to be tested. The diodes which qualify for simultaneous use in the combiner are only those which have measured frequencies of maximum power lying within a predetermined frequency band.

7 Claims, 6 Drawing Figures

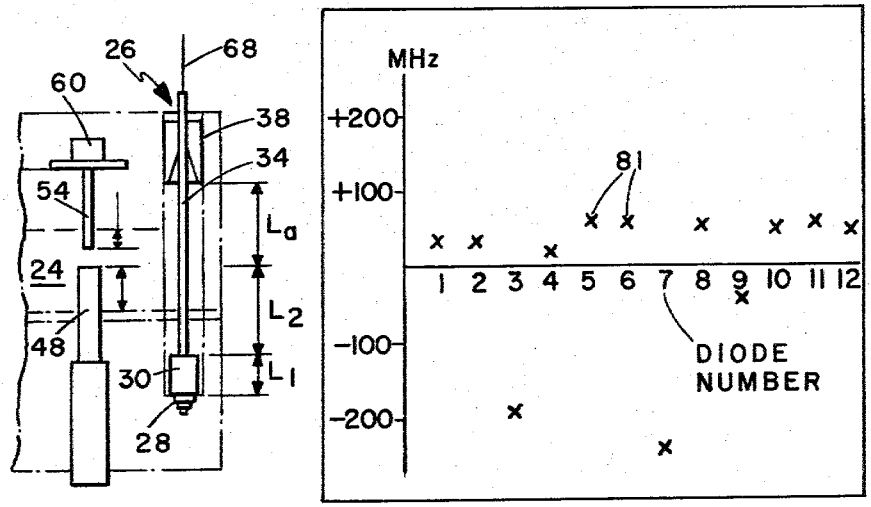
Fig. 1
Fig. 5
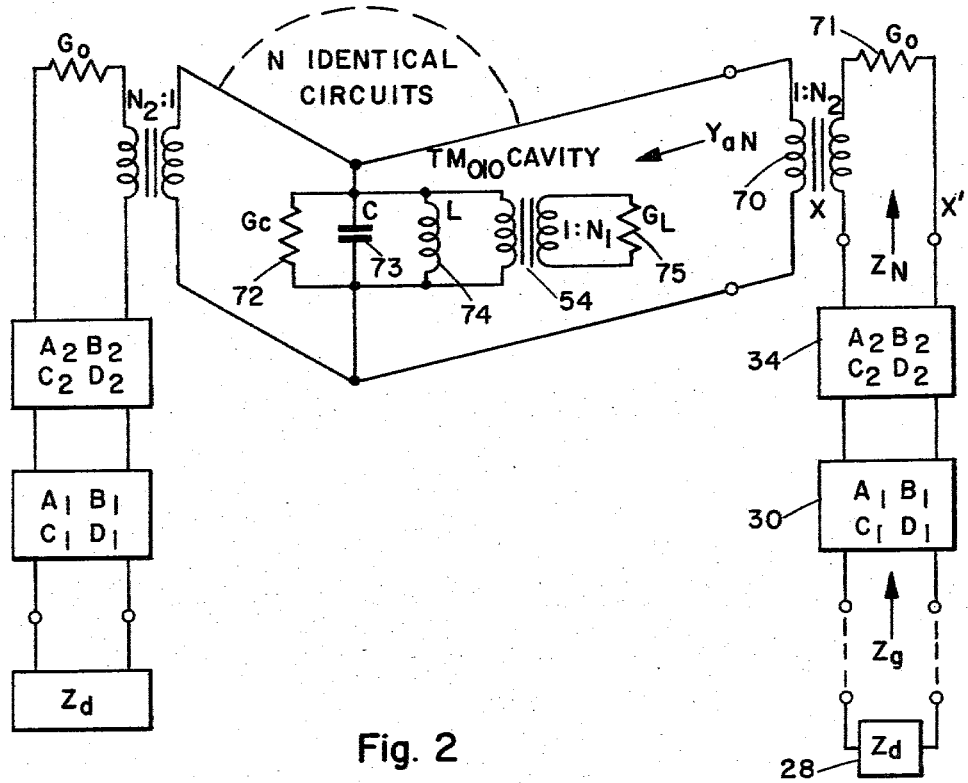
Fig. 2

EQ. 1    $Z_d = -Z_g$

EQ. 2    $Z_d = R_d + jX_d$

EQ. 3    $Z_g = R_g + jX_g$

EQ. 4    $Z_g = \dfrac{A_1 Z' + B_1}{C_1 Z' + D_1}$

EQ. 5    $Z' = \dfrac{A_2 Z_N + B_2}{C_2 Z_N + D_2}$

EQ. 6A    $A_i = \cos \dfrac{2\pi L_i \sqrt{\epsilon_i}}{\lambda_0}$

EQ. 6B    $B_i = jZ_i \sin \dfrac{2\pi L_i \sqrt{\epsilon_i}}{\lambda_0}$

EQ. 6C    $C_i = j(1/Z_i) \sin \dfrac{2\pi L_i \sqrt{\epsilon_i}}{\lambda_0}$

EQ. 6D    $D_i = A_i$    $(i = 1, 2)$

EQ. 7    $Z_N = \dfrac{1}{G_0} + \dfrac{N_2^2 N}{Y_{aN}}$

EQ. 8    $Y_{aN} = G_c + G_L N_1^2 + j(2\pi fC - \dfrac{1}{2\pi fL})$

EQ. 9    $Z_N = \dfrac{1}{G_0} + \dfrac{N_2^2 N}{G_c + G_L N_1^2 + j(2\pi fC - \dfrac{1}{2\pi fL})}$ EQ. 10    $G_c \ll G_L N_1^2$ EQ. 11    $f = \dfrac{1}{2\pi\sqrt{LC}}$ EQ. 12    $Z_N = \dfrac{1}{G_0} + \dfrac{N_2^2 N}{G_L N_1^2}$

Fig. 3

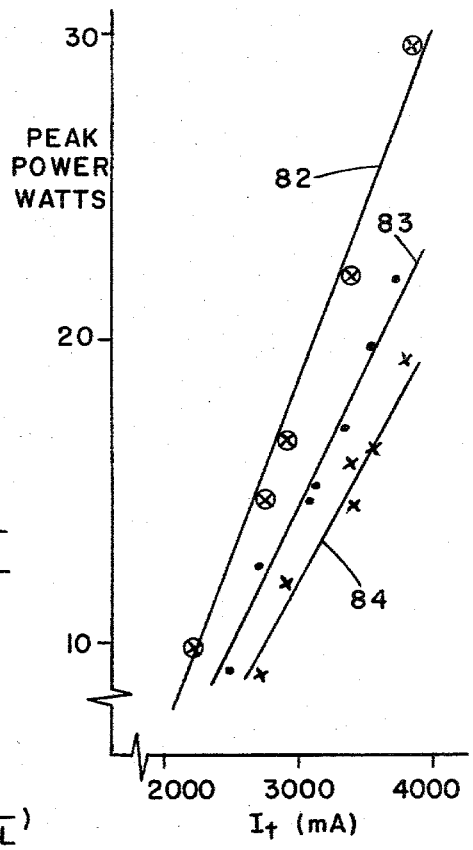

Fig. 6

METHOD OF QUALIFYING DIODES FOR A MICROWAVE POWER COMBINER

BACKGROUND OF THE INVENTION

This invention relates to microwave power combiners and methods for qualifying diodes for use therein. One power combiner with which the disclosed method may be used is described, for example, in U.S. Pat. No. 4,121,174. Basically, it includes a central cavity with a plurality of negative resistance diode oscillator circuits spaced around the perimeter. Each of the oscillator circuits furnish electromagnetic energy to the cavity. And the combined energy is taped off by a probe that is inserted into the cavity.

A problem that exists in the prior art, with which the disclosed invention is concerned, is that of determining how to qualify diodes for simultaneous use in the combiner. In the past, the diodes were tested by their manufacturers via circuits that were substantially different from the power combiner in which the diodes were eventually to be used. These circuits typically were co-axial circuits with a low Q and without any resonating cavity. Thus, it is reasonable to expect that the tests were not sufficient to determine which diodes would operate best in power combiners that had resonating cavities and a high Q.

The testing problem is complicated by the fact that diodes cannot simply be individually inserted into the power combiner with which they are to be used and there be tested one at a time. This is because the electrical impedance which each diode sees in the power combiner is dependent upon the total number of diode oscillators that are active. Thus, a diode which performs well in an individually activated oscillator circuit of a power combiner, still might not perform well when operated in parallel with all of the other oscillator circuits in the combiner.

Therefore, it is a primary object of the invention to provide a method of testing diodes for determining which of them will perform well in combination in a microwave power combiner.

SUMMARY OF THE INVENTION

This object, as well as others, is accomplished in accordance with the invention by first reducing the magnetic coupling between the output probe and the cavity. The reduced coupling $N_{11}$ is determined by the corresponding magnetic coupling $N_{12}$ that exists when all N of the oscillator circuits are simultaneously activated divided by the square root of N. Under these conditions, a bias current is supplied to a single diode in only one of the oscillator circuits; and the frequency at which the single diode supplies maximum power to the probe is measured. These steps are repeated for each of the individual diodes to be tested. Only those diodes which have measured frequencies of maximum power lying within a predetermined frequency band qualify for simultaneous use in the combiner.

BRIEF DESCRIPTION OF THE DRAWINGS

The steps of the method disclosed herein as well as the theory on which the method is based will best be understood by reference to the following detailed description when read in conjunction with the accompanying drawings wherein:

FIG. 1 is a schematic diagram of a power combiner with which the disclosed method may be used.

FIG. 2 is an equivalent circuit diagram of the power combiner of FIG. 1.

FIG. 3 is a set of equations describing the theory upon which the disclosed method is based.

FIG. 5 is a plot made from the test results of FIG. 4 that shows which diodes qualify.

FIG. 6 is a set of test results verifying the combinability predictions of FIG. 4.

DETAILED DESCRIPTION

Figure 4:
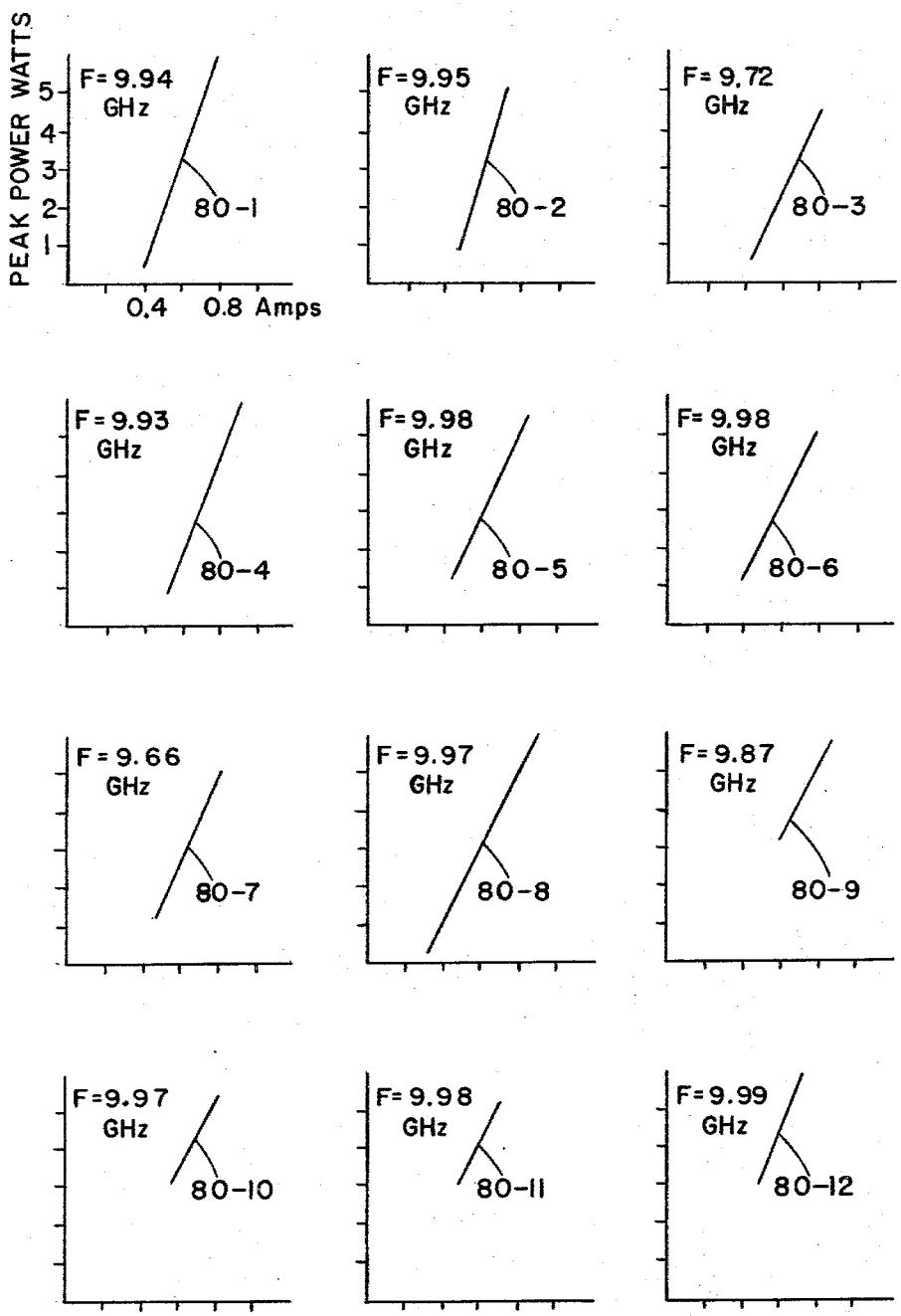
FIG. 4 is a set of curves illustrating test results from the initial steps of the disclosed method.

A schematic diagram of the microwave power combiner with which the disclosed method operates is illustrated in FIG. 1. This power combiner is described in detail in U.S. Pat. No. 4,121,174 issued Aug. 17, 1978, to the present applicant. All of the reference numerals in FIG. 1 of this case correspond to the reference numerals in the above cited patent.

Basically, the FIG. 1 power combiner includes a plurality of oscillator circuits as indicated generally by reference numeral 26. These oscillators are spaced co-axially around the perimeter of a cavity 24. In operation, the oscillators 26 provide electromagnetic energy to cavity 24. From there, the energy is transferred via electric field coupling to a probe 54. This probe in turn electrically connects via a jack 60 to an external load not shown.

Each of the oscillator circuits 26 include a negative resistance diode 28 such as an IMPATT diode. It is this diode which the disclosed method either qualifies or disqualifies for use in the combiner. Circuit 26 further includes a transformer 30, a conductor 34, and a damping member 38. This circuit oscillates in response to a bias current that is applied to diode 28 through a conductor 68.

An equipment circuit diagram of the FIG. 1 power combiner is illustrated in FIG. 2. There, the impedance presented by diode 28 is indicated via the term $Z_d$. Also, the impedance presented by transformer 30 and conductor 34 are indicated via respective ABCD matricies. A transformer 70 indicates the magnetic coupling between conductor 34 and cavity 24. And a conductance 71 indicates the load presented by the damping member 38 and any external bias source connected to conductor 68.

Also in FIG. 2, the cavity 24 is modeled as a parallel combination of the conductance 72, a capacitor 73, and an inductor 74. The value of these components depend upon the physical dimensions of cavity 24 as will be described shortly. Energy is transferred to these components by the magnetic coupling provided by transformer 70. And energy is transferred from these components by the electric field coupling that is provided by probe 54. In turn, the probe transfers energy to an external load 75 that connects to jack 60.

A condition for oscillation to occur in the FIG. 2 circuit is that the diode impedance $Z_d$ is the negative of the impedance $Z_g$ looking into transformer 30. This is indicated mathematically in equation 1 of FIG. 3. Also, generalized expressions for the impedances $Z_d$ and $Z_g$ are respectively given by equations 2 and 3.

Utilizing the equivalent circuit of FIG. 2, the impedance $Z_g$ can be rewritten in terms of the ABCD matricies 30 and 34. This is accomplished by equations 4 and 5. In those equations, the terms A1, B1, C1, D1, A2, B2, C2, and D2 can all be further expanded by the expressions given in equation 6A through 6D. There, $L_1$ and $L_2$ are the line lengths indicated in FIG. 1, $\lambda_0$ is the free space wavelength $\epsilon_i$ is the relative dielectric constant, $Z_1$ is the characteristic impedance of transformer 30, and $Z_2$ is the characteristic impedance of conductor 34.

Equation 5 can further be expanded by means of equation 7. There, the impedance $Z_N$ is expressed in terms of conductance 71, the magnetic coupling $N_2$ provided by transformer 70, the admittance $Y_{aN}$ connected to the secondary of transformer 70, and the number N of oscillator circuits in the power combiner. By inspection of FIG. 2, the admittance $Y_{aN}$ can be expanded in terms of the previously described circuit components 54 and 72 through 75. This is expressed in equation 8. Substitution of equation 8 into equation 7 yields equation 9 as a generalized expression for the impedance $Z_N$. Equation 9 may be greatly simplified however, if the conditions expressed by equations 10 and 11 are met. Experience shows that this is easy to do in practice. As a result, equation 9 reduces to equation 12. It follows from equations 12, 4 and 5 that the number of diodes N and the magnetic coupling factor $N_1$ that is provided by probe 54 appear only in the ratio $N/(N_1)^2$.

Thus, if N is decreased by an arbitrary integer multiple K, and $N_1$ is simultaneously decreased by the square root of K, the electrical impedance matching diode 28 will not change. This fact allows one to test diodes individually in the power combiner under electrical loading conditions that are identical to the loading conditions that will be present in a fully operating power combiner. And the results of this test can then be used to determine which diodes will perform best in parallel.

FIG. 4 is a set of curves illustrating the results of such individualized testing of the diodes 28. To obtain these curves, probe 54 is first inserted into cavity 24 to provide a reduced magnetic coupling $N_1 = N_{12}$ divided by the square root of N. That is, $N_{12}$ corresponds to the magnetic coupling between probe 54 and cavity 24 when all N of the oscillator circuits 26 are simultaneously activated.

Then, a bias current is applied via lead 68 to a diode in only one of the oscillator circuits 26. This activates electromagnetic oscillations in cavity 24, and transfers energy therefrom to probe 54. Under these condition, the frequency at which the single diode supplies maximum power to probe 54 is determined. This frequency is found by varying the length of plunger 48 which tunes cavity 24.

These steps are repeated for each of the diodes to be tested, then the results are tabulated as indicated via curves 80-1 through 80-12 of FIG. 4. In accordance with the invention, only those diodes whose measured frequencies of maximum power lie within a predetermined frequency band qualify for simultaneous use within the power combiner. Those diodes which so qualify may readily be seen by inspection of FIG. 5.

There, the measured frequencies 81 of maximum power for each of the diodes of FIG. 4 are plotted relative to one another. By inspection, it can be seen that all of the diodes except 3 and 7 have a measured frequency of maximum power lying within a 100 megahertz band. And it has been found that the performance of the power combiner is substantially decreased when "out-of-band" diodes such as 3 and 7 are used in combination with the "in-band" diodes. That is, the combination will produce less power even though individually the diodes produce substantially equal power. And even though they pass various vendors specifications, this degradation has been found to be attributed solely to the operation of the diodes. It is not due for example, to slight variations in the physical dimensions of co-axial oscillators 26.

FIG. 6 is a set of curves illustrating the results of some of the tests that show how the out-of band diodes effect performance. There, curves 82, 83, and 84 are plots of the output power from a power combiner when various groups of four different diodes were inserted therein. Diodes 2, 5, 6 and 10 operated together to yield curve 82. When diode 5 was replaced by either diode 3 or 7, curve 83 resulted. And when diodes 2 and 5 were replaced by diodes 3 and 7, curve 84 resulted. All of these curves were obtained with a magnetic coupling $N_{12}$ between cavity 24 and probe 54, where $N_{12}$ equaled the $\sqrt{N}$ times $N_{11}$.

Curves 82–84 clearly show that a substantial increase in the output power of a power combiner can be attributed to the selection of diodes that are used therein. Any of the curves also show that the above described method is an effective way to determine which diodes should be combined and which should not.

Various preferred steps for carrying out the disclosed method of qualifying diodes for use in a microwave power combiner have now been described in detail. In addition, many modifications and changes can be made to these steps without departing from the nature and spirit of the invention. Therefore, it is to be understood that the invention is not limited to said details but is defined by the appended claims.

I claim:

1. A method of qualifying diodes for simultaneous use in a microwave power combiner to improve the operation thereof; said combiner having a central cavity with N diode oscillator circuits spaced around the cavity for furnishing energy thereto; said method including the steps of;

inserting a probe into said cavity to provide an electric field coupling $N_{11}$ therebetween of the magnitude $N_{12}/\sqrt{N}$ where $N_{12}$ is the corresponding magnitude of magnetic coupling when all N of said oscillator circuits are simultaneously activated;

applying a bias current to a single diode in only one of said oscillator circuits to activate electromagnetic oscillations in said cavity and to transfer energy therefrom to said probe via said coupling $N_{11}$;

measuring the frequency at which said single diode supplies maximum power to said probe during said applying step;

repeating said applying step and measuring step on other individual diodes; and qualifying for simultaneous use in said combiner, only that portion of said diodes which have measured frequencies of maximum power lying within a predetermined frequency band.

2. A method according to claim 1 and further including the steps of;

inserting a probe into said cavity to provide said electric field coupling $N_{12}$ therebetween;

utilizing said qualified diodes in said N oscillator circuits of said combiner to simultaneously activate electromagnetic oscillations in said cavity.

3. A method according to claim 2 wherein said steps of inserting a probe into said cavity to provide said couplings of $N_{11}$ and $N_{12}$ is performed by providing a single electric probe having an adjustable length.

4. A method according to claim 12 wherein said steps of inserting a probe into said cavity to provide said couplings of $N_{11}$ and $N_{12}$ is performed by providing a pair of fixed length probes.

5. A method according to claim 2 wherein N is $\leq 16$.

6. A method according to claim 1 wherein said steps of measuring the frequency at which the single diodes supply maximum power is performed by providing a tuning plunger that extends into said cavity to an adjustable distance.

7. A method according to claim 1 wherein said frequency band has a width of less than 100 megahertz and a center frequency in the gigahertz range.

* * * * *